US005614435A

United States Patent [19]
Petroff et al.

[11] Patent Number: 5,614,435
[45] Date of Patent: Mar. 25, 1997

[54] QUANTUM DOT FABRICATION PROCESS USING STRAINED EPITAXIAL GROWTH

[75] Inventors: Pierre Petroff, Santa Barbara; Devin Leonard, Goleta, both of Calif.; Mohan Krishnamurthy, Houghton, Mich.

[73] Assignee: The Regents of the University of California, Oakland, Calif.

[21] Appl. No.: 330,303

[22] Filed: Oct. 27, 1994

[51] Int. Cl.$^6$ .................................. H01L 21/20
[52] U.S. Cl. ............................. 437/110; 117/85
[58] Field of Search ........................... 437/110; 117/85

[56] References Cited

U.S. PATENT DOCUMENTS

| | | | |
|---|---|---|---|
| 4,931,132 | 6/1990 | Aspnes et al. | 117/85 |
| 5,205,900 | 4/1993 | Inoue et al. | 117/85 |
| 5,238,525 | 8/1993 | Turner et al. | 117/85 |
| 5,281,283 | 1/1994 | Tokunaga et al. | 437/110 |
| 5,354,707 | 10/1994 | Chapple-Sokol et al. | 437/110 |

FOREIGN PATENT DOCUMENTS

| | | | |
|---|---|---|---|
| 535293 | 4/1993 | European Pat. Off. | 437/110 |
| 326421 | 11/1991 | Japan | 437/110 |
| 354323 | 12/1992 | Japan | 437/110 |

OTHER PUBLICATIONS

Steigerwald et al., "Synthesis, Stabilization, & Electronic Structure of Quantum Semiconductor Nanoclusters," Annu Rev Mater Sci 1989. 19:471–95.

Stucky et al., "Quantum Confinement & Host/Guest Chemestry: Probing a New Dimension," Science, vol. 247, 9 Feb. 1990, Articles 669–678.

Olshavsky et al., "Organometallic Synthesis of GaAs Crystallites Exhibiting Quantum Confinement," J. Am. Chem. Soc. 1990, 112, 9438–9439.

Copel et al., "Surfactants in Epitaxial Growth," vol. 63, No. 6, 7 Aug. 1989, 632–635.

Saunders et al., "Vapor Phase Synthesis of Crystalline Nanometer–Scale GaAs Clusters," Appl.Phys.Lett. 60(8), 24 Feb. 1992, 950–952.

Brandt et al., "InAs Quantum Dots in a Single–Crystal GaAs Matrix," Physical Review B, vol. 44, No. 15, 15 Oct. 1991–I, 8043–8053.

Guha et al., "Onset of incoherency and defect introduction in the initial stages of molecular beam epitaxial growth of highly strained $In_xGa_{1-x}As$ on GaAs(100)," Appl. Phys. Lett., vol. 57, No. 20, 12 Nov. 1990, 2110–2112.

Eaglesham et al., "Dislocation–Free Stranski–Krastanow Growth of Ge on Si(100)," Phys Rev Lett, vol. 64, No. 16, 16 Apr. 1990, 1943–1946.

Snyder et al., "Effect of Strain on Sufrace Morphology in Highly Strained InGaAs Films," Phys Rev Lett, vol. 66, No. 23, 10 Jun. 1991, 3032–3035.

Krishnamurthy et al., "Microstructural evolution during the heteroepitaxy of Ge on vicinal Si(100)," J.Appl.Phys. 69(9), 1 May 1991, 6461–6471.

Orr et al., "A Model for Strain–Induced Roughening and Coherent Island Growth," Europhys. Lett. 19(1), pp. 33–38 (1992).

Primary Examiner—Robert Kunemund
Attorney, Agent, or Firm—Daniel L. Dawes

[57] ABSTRACT

A process for production of self-assembled quantum dots is described which does not entail any processing steps before or after growth of the quantum dots. The process uses in situ formation of three dimensional islands which occurs during epitaxy of material with a different lattice parameter than the substrate. Further deposition of the substrate material then produces single or multiple buried two dimensional layers of randomly distributed or selectively positioned and substantially uniform sized quantum dots. These layers are free of defects and interface states. The lateral dot diameters vary between 140 to 300 Angstroms by appropriate choice of deposition parameters.

26 Claims, 10 Drawing Sheets

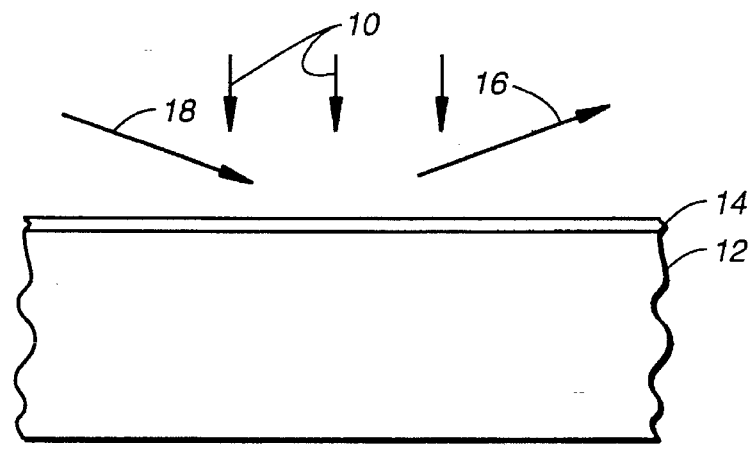
FIG._1a
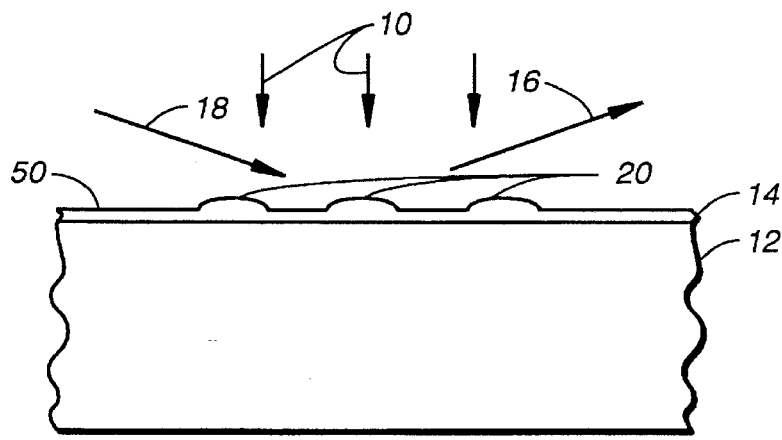
FIG._1b
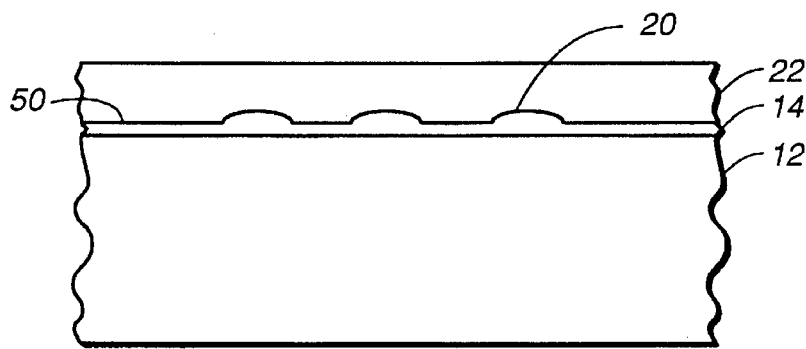
FIG._1c

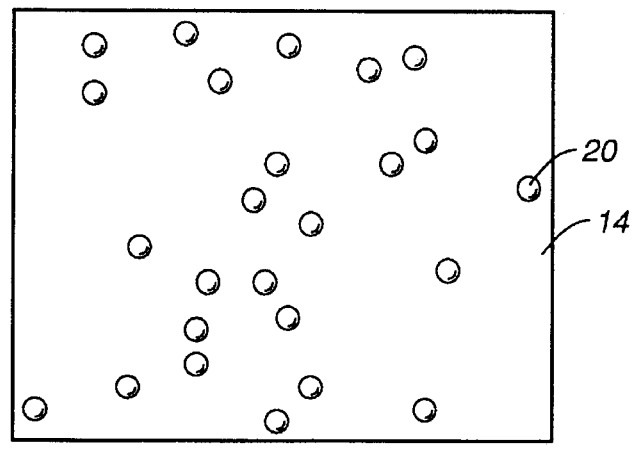
FIG._2
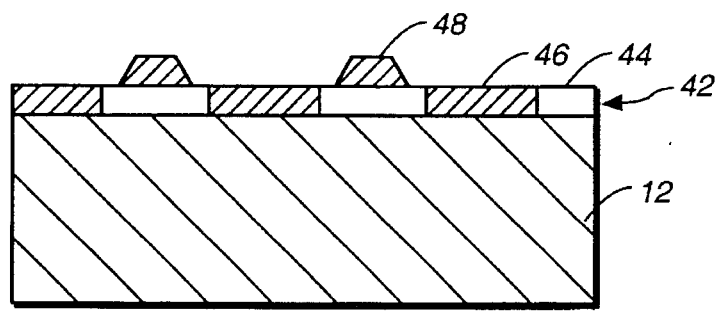
FIG._7
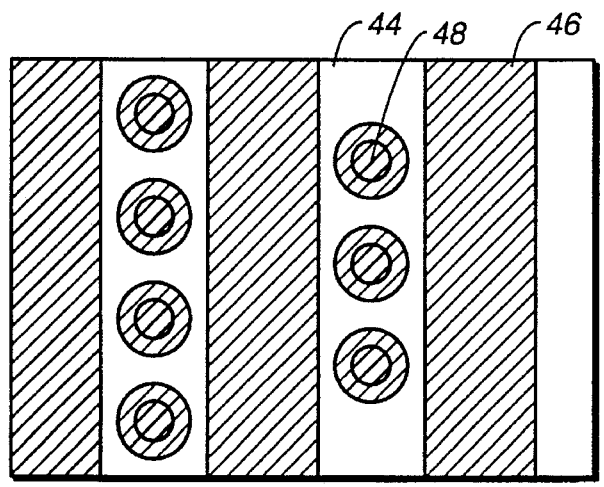
FIG._8

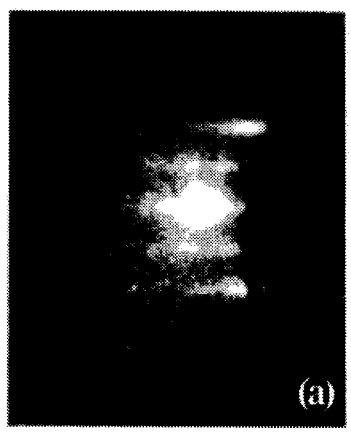 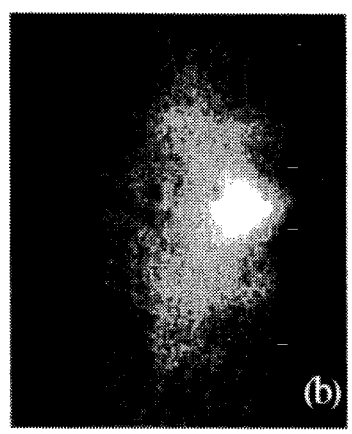 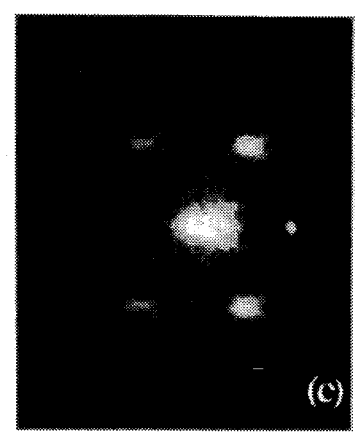
FIG._3a  FIG._3b  FIG._3c

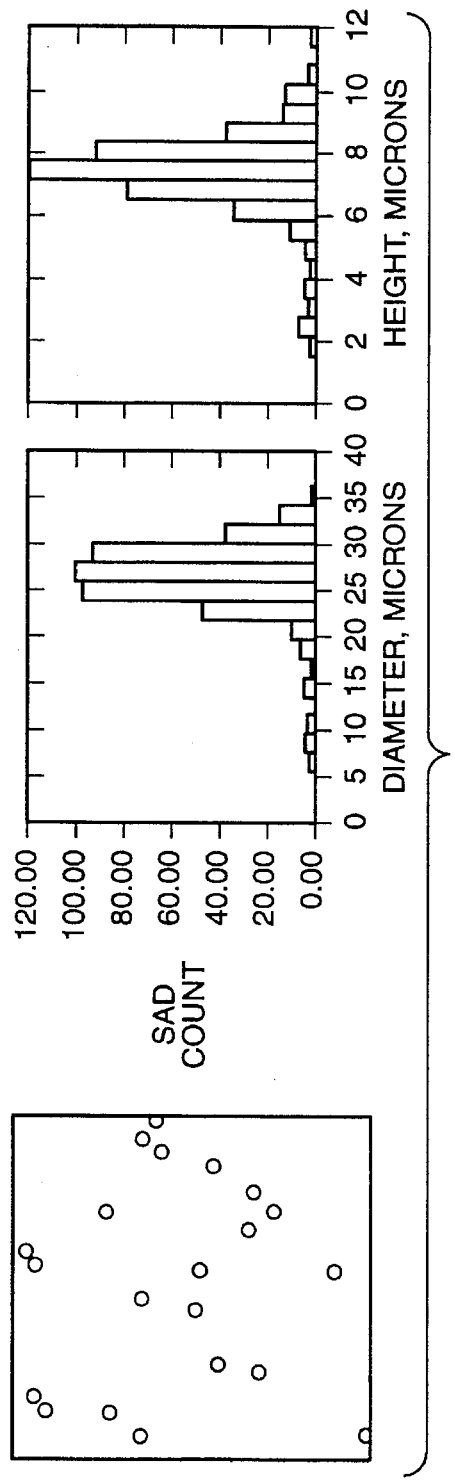
FIG._4a
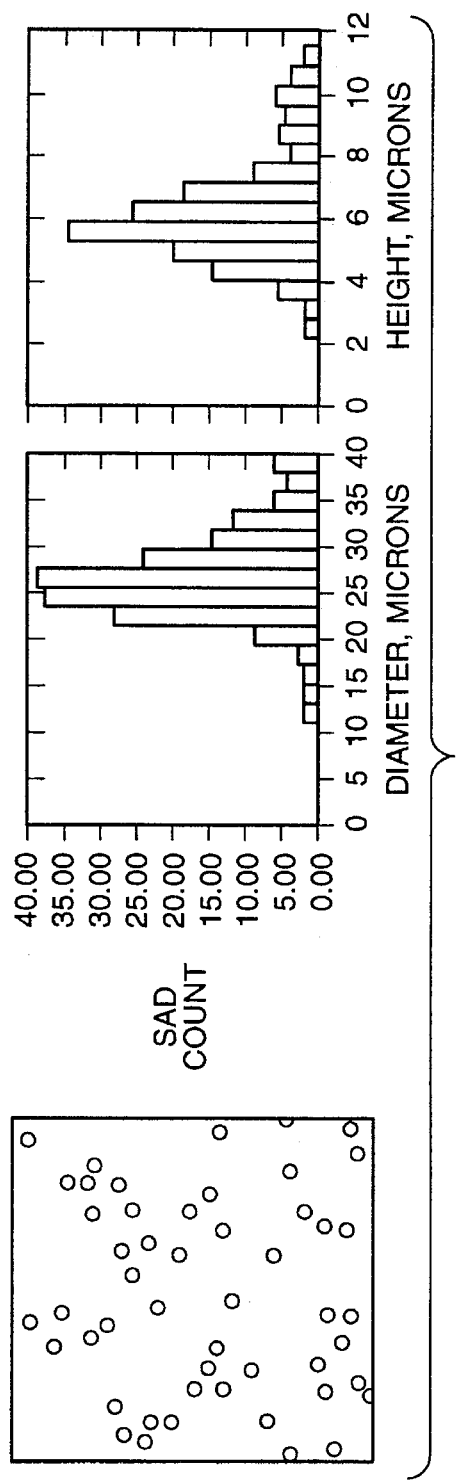
FIG._4b

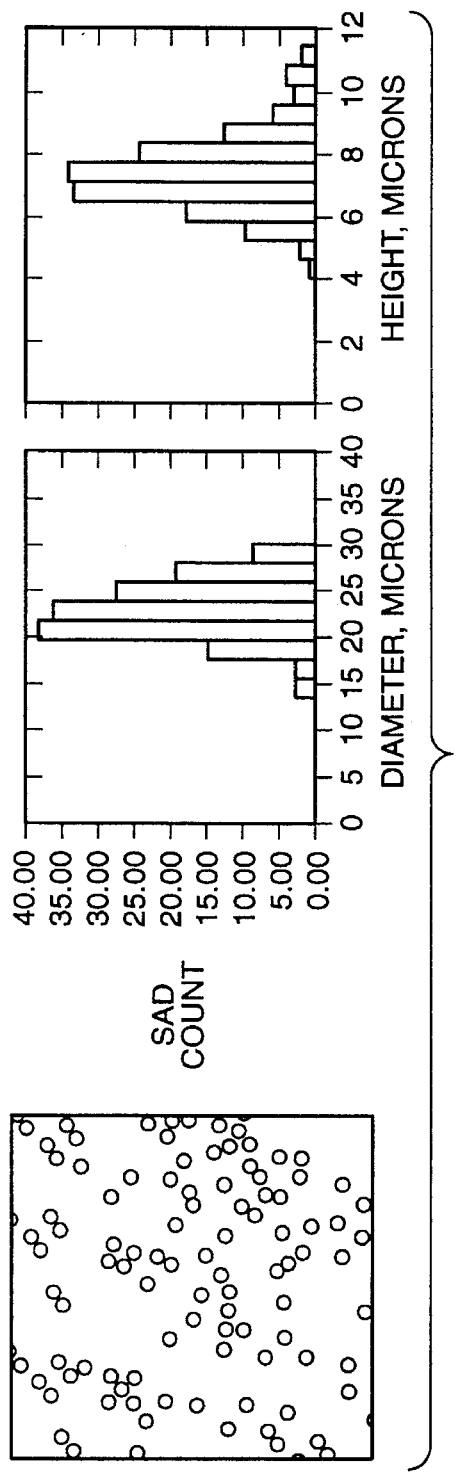
FIG._4c
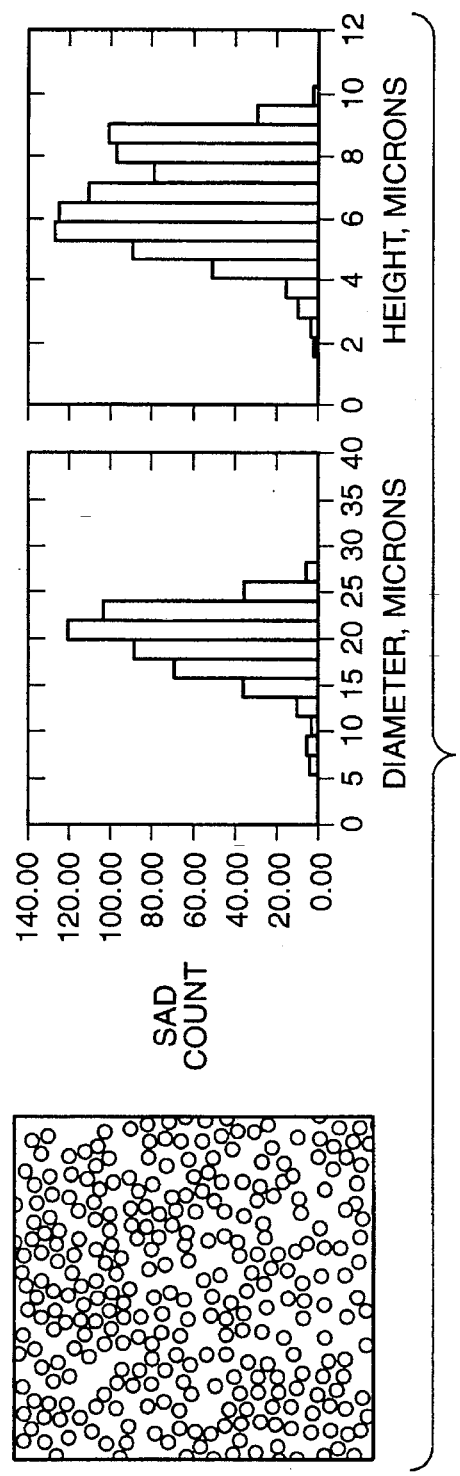
FIG._4d

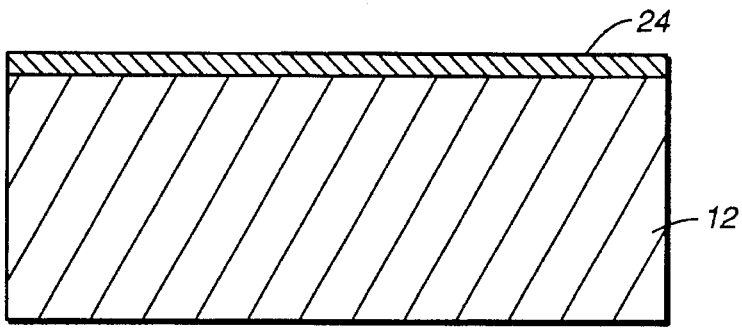
FIG._5a
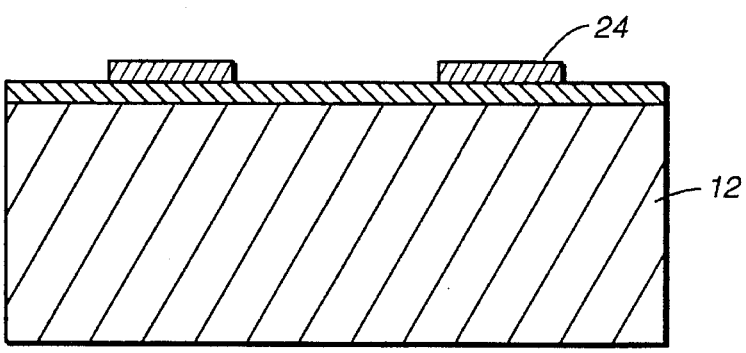
FIG._5b
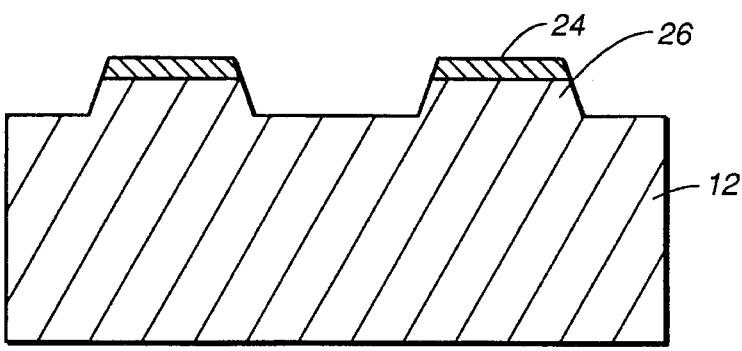
FIG._5c
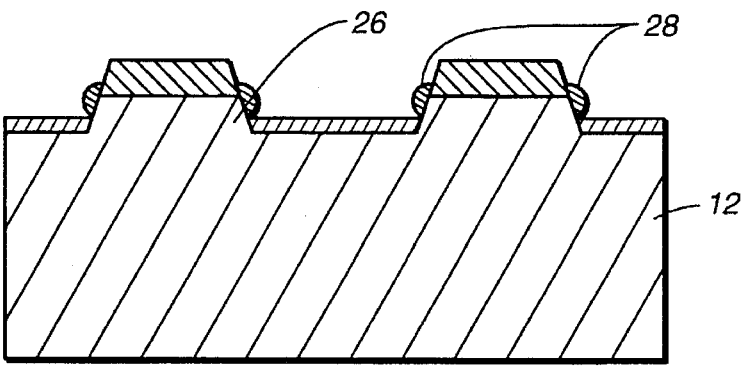
FIG._5d

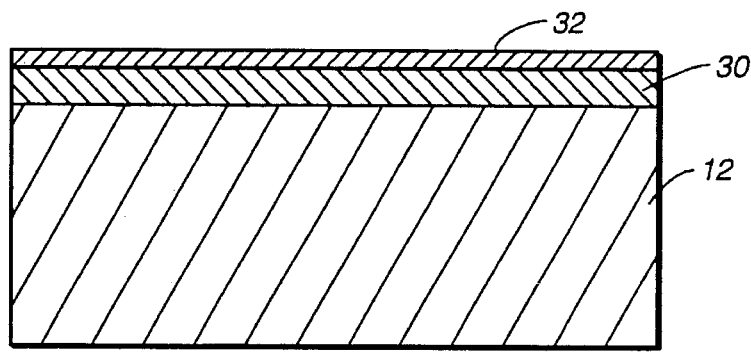
FIG._6a
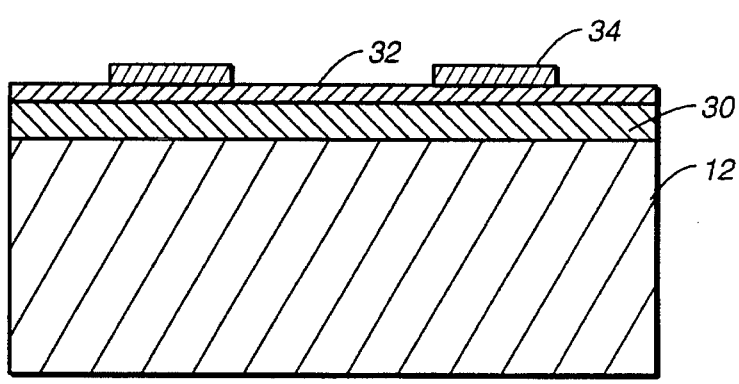
FIG._6b
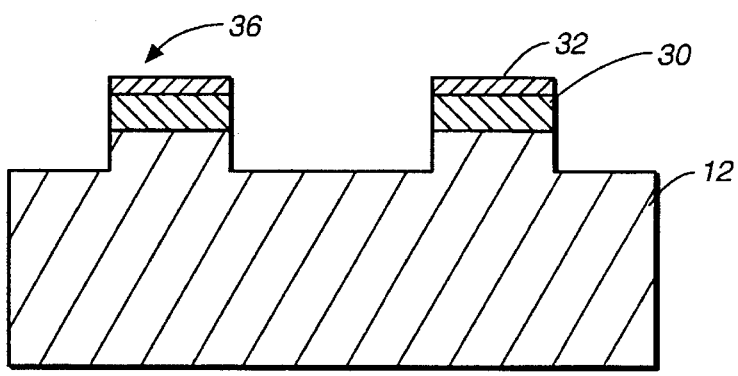
FIG._6c
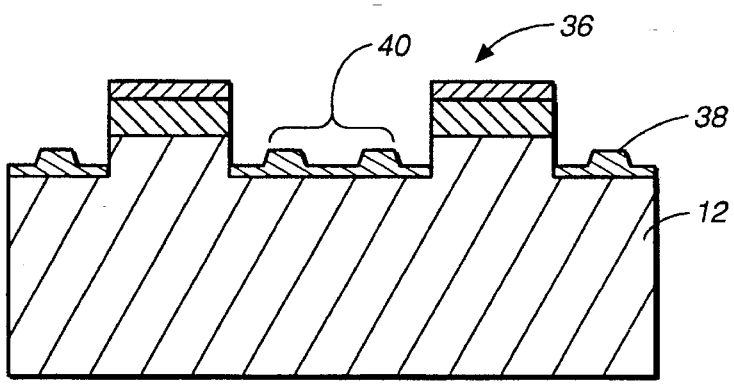
FIG._6d

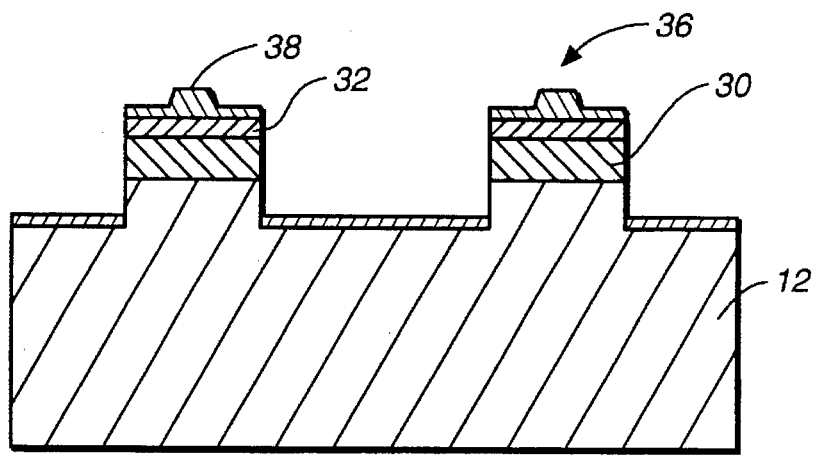
FIG._6e
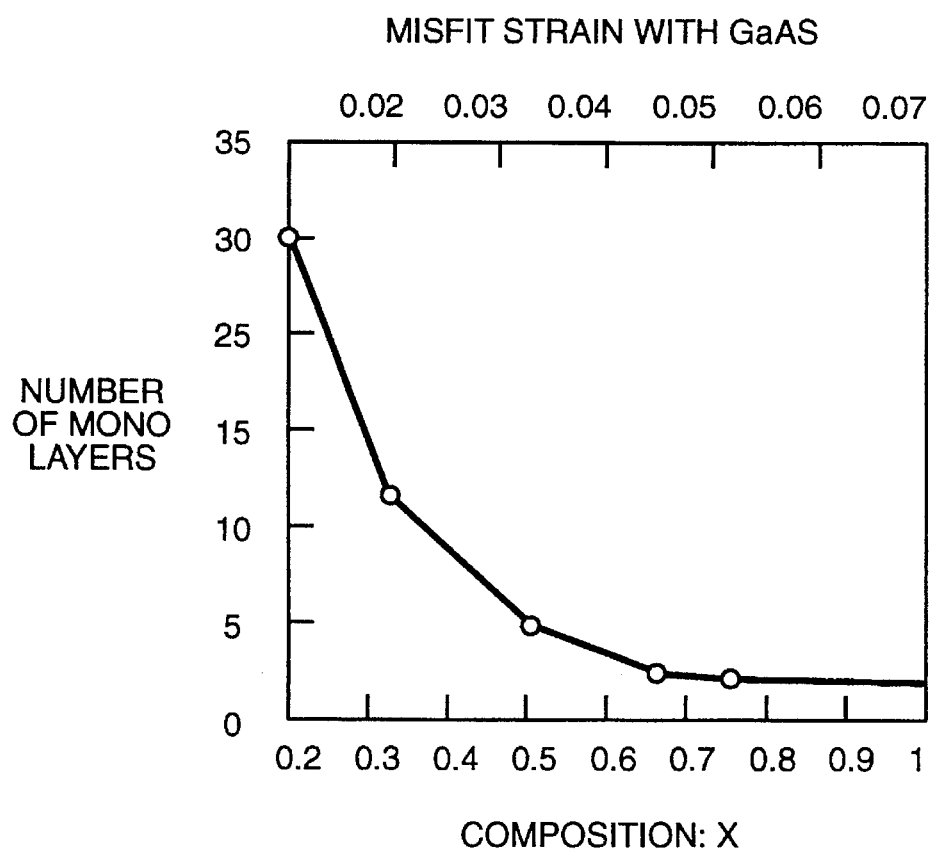
FIG._6f

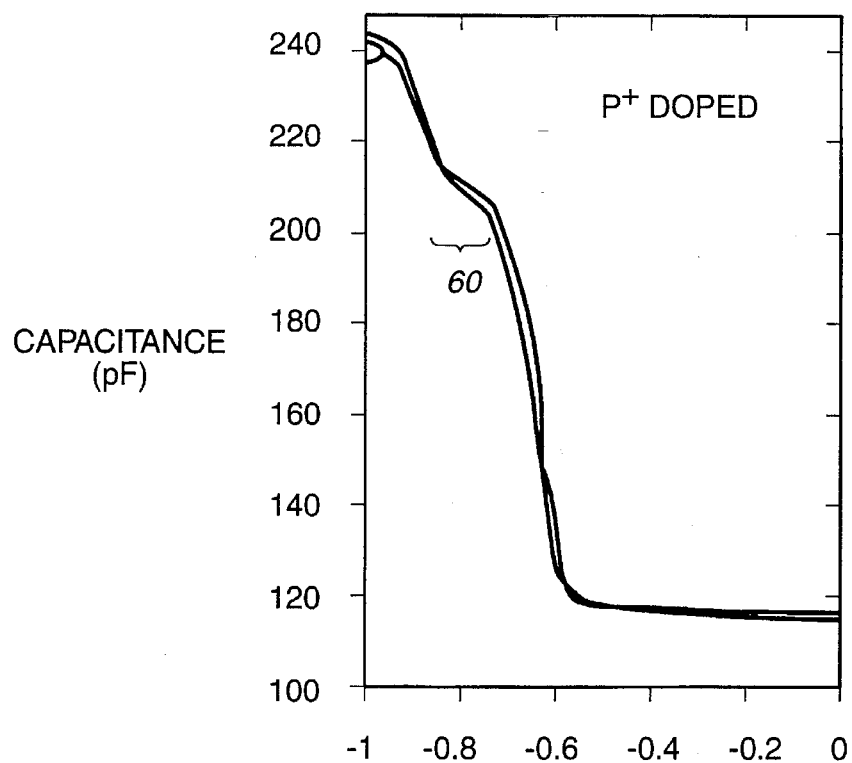
FIG._9a
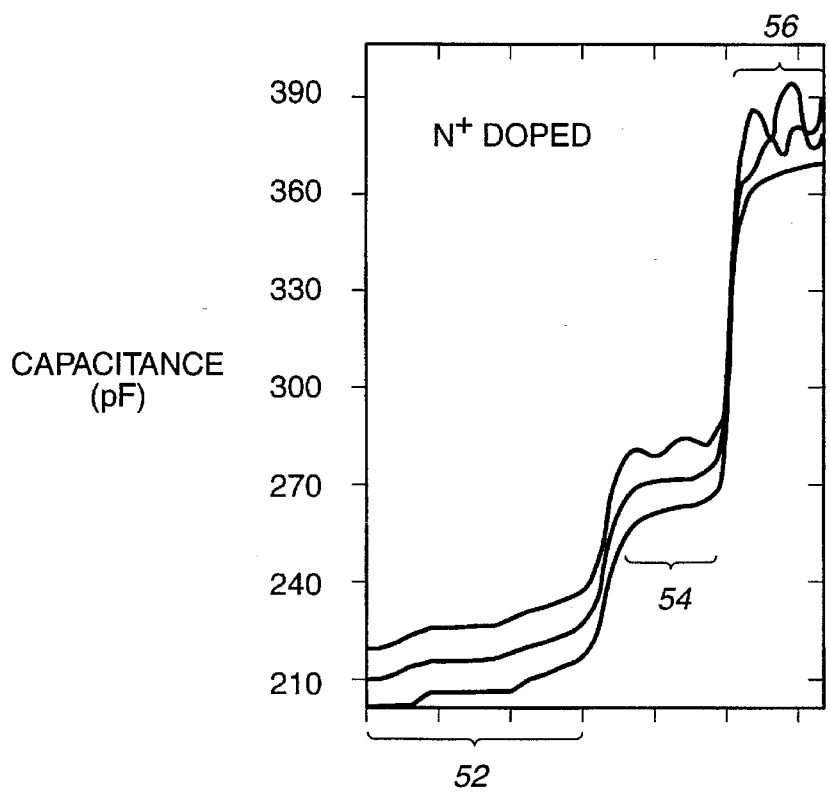
FIG._9b

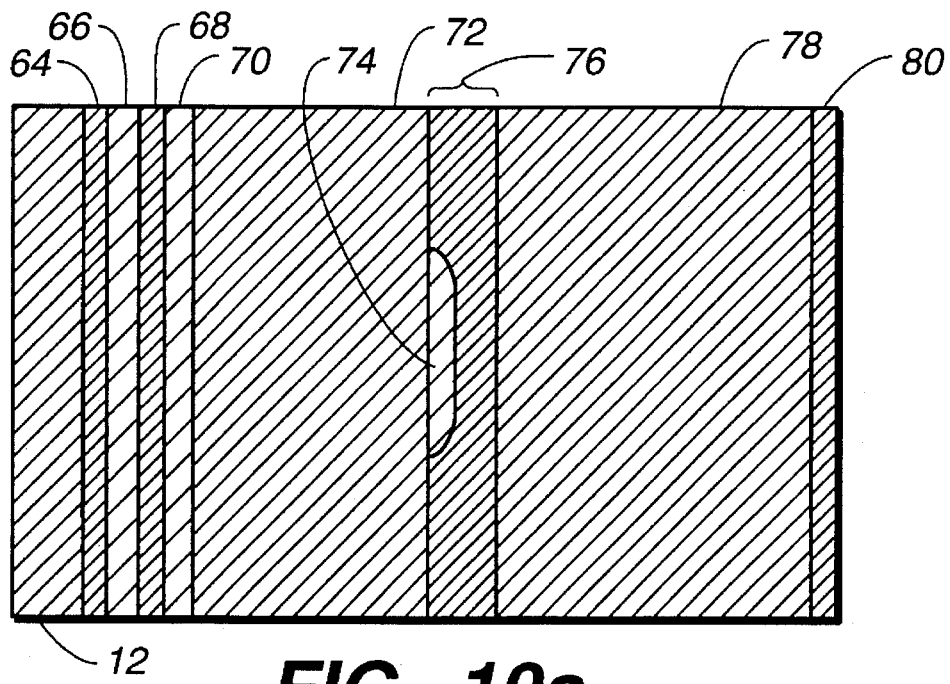
FIG._10a
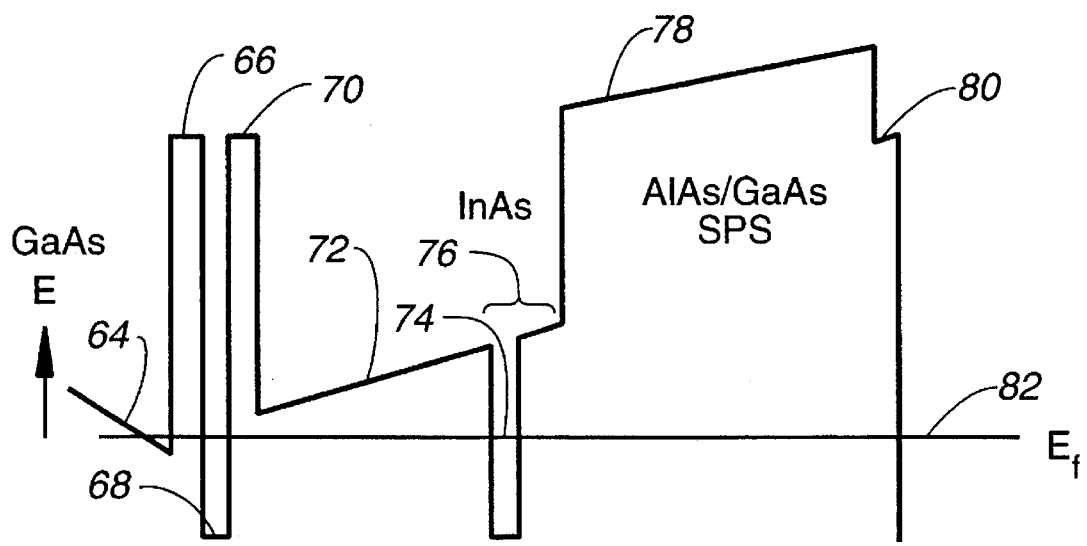
FIG._10b

QUANTUM DOT FABRICATION PROCESS USING STRAINED EPITAXIAL GROWTH

This invention was made with Government support under Grant No. DMR 91-20007, awarded by the National Science Foundation and Contract No. F49620-92-J-0124, awarded by the U.S. Air Force. The Government has certain rights in this invention.

BACKGROUND OF THE INVENTION

1. Field of the Invention

The invention relates to the field of fabrication processes and structures for quantum dots, and in particular, for semiconductor quantum dots and the process for making the same using strains created in the epitaxial growth layer as a result of differences in crystalline lattice spacing.

2. Description of the Prior Art

The fabrication of very small semiconductor structures to exploit the quantum mechanical behavior of carriers within semiconductor material is well established. However, the fabrication of practical structures for quantum confinement in two dimensions (quantum wire) and in three dimensions (quantum dots) has generally been unsatisfactory. In an attempt to attain the highest levels of confinement, as in a quantum dot, several methods have been used, including growth on vicihal surfaces. See O. Brantit et al., Phys. Rev. B 44, 8043 (1991) for the use of cluster formation from solution precursors; see M. L. Steigerwald et al., Ann. Rev. Mater. Sci. 19, 471 (1989), and M. A. Olshavsky et al., J. Amer. Chem. Soc. 112, 9438 (1990), for gas-phase nucleation; see A. Saunders et al., Appl. Phys. Lett. 60, 950 (1992), see G. D. Stucky et al., Science 247, 669 (1990), for loading of semiconductors and mesoporous cages; and for several other ex-situ processing techniques, see Optics of Excitons in Confined Systems, A. Quatropani Editor Institute of Physics, London, (1991). Most of these prior techniques suffer from poor interface quality and size nonuniformity giving rise to large surface recombination velocities.

Highly strained heteroepitaxial growth generally proceeds by the formation of islands after initial layer-by-layer growth which is referred to as StranskiKrastanow growth. Recent studies of indium gallium arsenide, (InGaAs) on gallium arsenide (GaAs) by scanning tunneling microscopy and transmission electron microscopy and of germanium/silicon (Ge/Si) by transmission electron microscopy have demonstrated that at the initial stages of formation, these islands are dislocation-free and coherently strained to the substrate, See S. Guha et al., Appl. Phys. Lett. 57, 2110 (1990); for transmission electron microscopy see D. J. Eaglesham et al., Phys. Rev. Lett. 64, 1943 (1990); and for transmission electron microscopy in Ge/Sise M. Krishnamurthy et al., J. Appl. Phys. 69, 6461 (1991) and B. G. Orr et al., Euro Phys. Lett. 19, 33 (1992).

Though a clear mechanism for this strain relief has yet to emerge, it is thought to occur by elastic relaxation of the nearest substrate layer or by kinetics of strain induced surface roughening, C. W. Syder et al., Phys. Rev. Lett. 66,3032 (1991). It is clear that at the initial stages of growth, introduction of dislocations arising out of misfit relief can be avoided. At the later stages of growth, dislocations may form when the islands coalesce, leading to the degradation of the layer. Consequently, most of the studies have concentrated on suppressing island formation, such as shown by M. Kopel et al., Phys. Rev. Lett. 63, 632 (1989), or on using growth kinetics to extend the onset of islanding. Studies of the microstructure evolution of coherent islands have been reported for germanium on silicon by M. Krishnamurthy et al. supra and M. Tabuchi et al., Science and Technology Mesoscopic Structures, S. Namba et al. editor (Springer, Tokyo 1992) at page 379. It was shown that under certain growth conditions, sharp island-size distributions could be obtained, M. Krishnamurthy et al. supra. A study of the InAs three dimensional islands on GaAs surfaces was performed and the optical properties were reported, although island-size distributions or defects associated with them were not considered.

What is needed then is a methodology for fabricating quantum dot structures without any of the additional processing steps which the prior art studies would dictate is required, and for fabricating quantum dot structures with a uniformity of defect-free dots with sharply peaked, size distributions.

BRIEF SUMMARY OF THE INVENTION

The invention is a method of forming quantum dots comprising disposing a material having a first lattice spacing on a substrate having a second unequal lattice spacing to produce self-assembled quantum dots. The surface texture of the first material is continuously observed as it is being disposed on the substrate. The deposition of the first material on the substrate is immediately terminated as soon as a predetermined number of the self-assembled quantum dots form as determined by observation of the surface texture during deposition of the first material. As a result, a plurality of quantum dots of predetermined size and density are controllably and reliably fabricated.

The observation of the surface texture of the first material comprises exposing the surface of the first material to high energy electrons and detecting a reflection high energy electron diffraction pattern produced therefrom.

The deposition of the first material on the substrate comprises cycles of disposing a fractional monolayer of the first material followed by a no growth pause of a predetermined time period. The deposition of the fractional monolayer of the first material is preferably of the order of 0.1 monolayer per second. The no growth pause has a period of approximately three seconds. The method comprises disposing a capping layer on the self-assembled quantum dots composed of the second material on the substrate.

In one embodiment the first material disposed on the substrate has a greater lattice spacing than the second material of the substrate thereby placing the first material under compression. In another embodiment the first material disposed on the substrate has a lattice spacing less than the lattice space of the second material of the substrate thereby placing the first material under tension. In particular, the first material disposed on the substrate is InAs and the substrate is composed of GaAs to thereby form InGaAs, InAlAs or InAs self-assembled quantum dots.

In another embodiment the first material disposed on the substrate is InAlAs and the substrate is AlGaAs substrate to thereby form InAlAs self-assembled quantum dots.

In the illustrated embodiment the first material is disposed on the substrate by molecular beam epitaxy, but equivalent technologies such as metal organic chemical vapor deposition, vapor phase epitaxy, chemical beam epitaxy, and gas source molecular beam epitaxy can be substituted.

The first material disposed on the substrate and the substrate may be chosen from semiconductors in Group IIIa and Va, Group IIb and VIa, semiconductors from different element from Group IVa of the periodic table, or semiconductors from consecutively grown epitaxial metals and oxides with a lattice mismatch. The method is equally applicable to metals.

The method further comprises forming selected regions of preferred nucleation for the self-assembled quantum dots on the substrate prior to disposing the first material on the substrate to align the self-assembled quantum dots in a predetermined two dimensional pattern.

In one embodiment the selected regions of preferred nucleation are formed by locally modulating surface orientation of the substrate. The substrate has a primary surface upon which the first material is directed, and locally modulating the surface orientation of the substrate comprises the forming facets in the substrate inclined at an angle with respect to the primary surface of the substrate.

In another embodiment forming the selected regions preferred nucleation comprises locally modulating surface strain of the substrate. Locally modulating surface strain of the substrate comprises selectively forming a third material having a lattice mismatch with the second material of the substrate selectively underlying surface portions of the primary surface of the substrate.

In a third embodiment forming selected regions of preferred nucleation comprises fluctuating material composition in the primary surface of the substrate. The composition fluctuation is provided by defining a lateral superlattice into the primary surface of the substrate. The superlattice having two distinct regions. A first region having a lattice mismatch with the first material and the second region being substantially lattice matched with the first material.

The invention is also characterized as a self-assembled quantum dot comprising a substrate, an island of material having a lattice mismatch with the substrate epitaxially grown on the substrate at or below a predetermined rate and terminated at a time determined by observation of the surface just before the epitaxially grown island transitions from two to three dimensional growth phases. A capping layer is disposed over the islands to form the self-assembled quantum dots. The capping layer has a lattice spacing substantially the same as the substrate. As a result, the self-assembled quantum dot structure is reliably and controllably fabricated.

The quantum dot structure further comprises a double tunnel barrier disposed beneath the substrate to island interface for filtering charge carriers that will fill the quantum dots as an increase bias is applied to the self-assembled quantum dot to fill the dots with electron or holes.

The invention may be better visualized by now turning to the following drawings wherein like elements are referenced by like numerals.

BRIEF DESCRIPTION OF THE DRAWINGS

FIGS. 1a–c are a diagrammatic side cross sectional views in enlarged scale of the process whereby InGaAs islands grown on a GaAs substrate.

FIG. 2 is a plan view of transmission electron micrographs the quantum dots shown in FIGS. 1a–c.

FIGS. 3a–c are photographic depictions of a typical reflection high energy electron diffraction pattern through which formation the quantum dots of the invention are monitored and controlled.

FIGS. 4a–d are histograms of the quantum dot diameter and height for different densities of quantum dots devised according to the invention.

FIGS. 5a–d is a diagrammatic side cross sectional view of the steps by which diffusion induced ordered quantum dots of the invention may be formed.

FIG. 6a–e is a diagrammatic side cross sectional view of the steps by which strain induced ordered quantum dots of the invention may be formed.

FIG. 6f is a graph of the number of monolayers of $In_xGa_{1-x}As$ which need to be laid down on the GaAs substrate in FIG. 6a verses $In_xGa_{1-x}As$ or the degree of misfit strain.

FIG. 7 is a cross sectional side view in enlarged scale of another method by which self-ordered quantum dots of the invention may be formed.

FIG. 8 is a top plan view of the self-ordered quantum dots shown in FIG. 7.

FIGS. 9a and b are graphs of the capacitance verses the bias voltage of quantum dot device demonstrating filling of the quantum energy states in the dots by electrons or holes.

FIG. 10a is a side cross-sectional view of an improved capacitance device using tunnel filters.

FIG. 10b is the energy diagram relating to and aligned with the device of FIG. 10a.

The invention and its various embodiments may now be understood by turning to the following detailed description.

DETAILED DESCRIPTION OF THE PREFERRED EMBODIMENTS

A process for production of self-assembled quantum dots is described which does not entail any processing steps before or after growth of the quantum dots. The process uses in situ formation of three dimensional islands which occurs during epitaxy of material with a different lattice parameter than the substrate. Further deposition of the substrate material then produces single or multiple buried two dimensional layers of randomly distributed or selectively positioned and substantially uniform sized quantum dots. These layers are free of defects and interface states. The lateral dot diameters vary between 100 to 300 Angstroms by appropriate choice of deposition parameters.

Strained epitaxial films are known to undergo a phase transition during deposition which is observed as a decomposition of the two dimensional epitaxial surface into three dimensional islands. The islands are dislocation-free when initially formed, see Eagleshram, supra. The decomposition occurs at a critical difference of the deposited material and is normally considered a nuisance, see C. W. Synder et al., Appl. Phys. Lett. 62, 46 (1990). This observed property is exploited in the present methodology to provide a fabrication process for quantum dots. By interrupting the growth of the strain film at or just below the thickness for three dimensional island formation, extremely small and quite uniform islands of usually less than 300 angstroms in the lateral dimension are formed of the deposited material. The islands are buried by deposition of the substrate material in a subsequent step to create a layer of quantum dots free of surfaces, dislocations and surface states due to subsequent processing steps.

A three dimensional band gap modulation is then directly built into the structure to produce useful quantum dots. By fabricating quantum dots during growth, typical problems such as large recombination velocities and surface depletion which arise from surfaces exposed while patterning the substrate before or after growth are avoided. The method in the invention requires no processing steps before or after growth of the quantum dots and, therefore, creates quantum dots with good quality molecular beam epitaxy grown interfaces.

FIGS. 1a–c illustrates the methodology of the invention in diagrammatic form. As an example, cycles of the deposition of 0.25 monolayers of $In_{0.5}Ga_{0.5}As$ and followed by one three-second arsenic gas phase pause of no growth are employed using molecular beam epitaxy. As symbolically denoted by reference numeral 10, a partial monolayer is disposed by molecular beam epitaxy, as symbolically denoted by reference numeral 14 in the FIG. 1a, onto a GaAs substrate 12. During the process, the surface growth of the InGaAs is monitored by detecting a reflection high energy electron diffraction pattern, symbolically denoted by reference numeral 16, reflected from layer 14 which is exposed to a high energy electron beam, symbolically denoted by reference numeral 18.

The cycle of deposition of partial monolayers of InGaAs on the GaAs substrate 12 followed by a three-second arsenic gas pauses is repeated until pattern 16 shows a transformation to a spotty pattern indicative of the formation of three dimensional islands 20 growing on the surface of layer 14 as diagrammatically depicted in FIG. 1b. An actual reflection high energy electron diffraction pattern is shown in the photographs of FIG. 3a which would correspond to the initial situation of FIG. 1a. Pattern 16 can be described as a series of streaky lines which is typical for an electron diffraction pattern from a semiconductor planar surface. As a surface of layer 14 begins to obtain a contour by virtual of the lattice mismatch between the InGaAs of the epitaxially deposited layer 14 and the lattice spacing of the underlying GaAs substrate 12, pattern 16 begins to blur as shown in FIG. 3b, ultimately assuming a spot pattern as shown in FIG. 3c, which is indicative of the formation of islands 20 in FIG. 1b.

As soon as formation of the three-dimensional islands 20 is detected as shown in FIG. 3b, layer 14 is then immediately capped with a layer of the same material as substrate 12, e.g. with about 300 angstroms of GAAs, at the same nominal substrate temperature, e.g. 530 degrees Centigrade, as diagrammatically shown in FIG. 1c. Typically, the InGaAs quantum dots 20 form in the process of FIG. 1a–c after about four monolayers of deposition of InGaAs on the GaAs substrate at a temperature of 530 degrees C. Although the strain field of the quantum dot 20 is seen to extend into the substrate and in overgrown layers 22, no dislocations are apparent. Because the strain field on substrate 10 is radially symmetric, quantum dots 20 are also radially symmetric. The lateral size of islands 20 on layer 14 is typically less than about 300 angstroms, although size of quantum dots 20 can be adjusted by choosing the degree of lattice mismatch or strain and the substrate temperature. Generally, as the degree of lattice mismatch and the strain increases, the dot size decreases. As the substrate temperature during formation increases, the dot size also increases. Strain mismatch can be modified by changing the relative amounts of In and Ga deposited in layer 14.

Although the process described in FIG. 1a–c has been described in terms of molecular beam epitaxy, many other types of growth technologies can be substituted. For example, metal organic chemical vapor deposition, vapor phase epitaxy, chemical beam epitaxy, gas source molecular beam epitaxy, and other similar technologies can be used with equal applicability.

FIG. 2 is a plan view of quantum dots 20 as shown in a transmission electron microscope micrograph, where the operating diffraction vector is perpendicular to the black and white lobes. The black and white contrast seen under a two beam dynamic diffraction conditions is typical of the strain coherent precipitates in a matrix with a radially symmetric strain field.

Although the illustrated embodiment has been described in connection with InGaAs on GaAs, many other semiconductor materials can be equivalently substituted. For example, any material system including Group IIb–VIa semiconductors from the periodic table (attached as an appendix), Group IIIa–Va semiconductors, Group IVa—IVa semiconductors such as Si/SiGe, and metals and oxides which can be deposited through consecutive epitaxy with a lattice mismatch can be used. The process can be applied to construct single or multiple layers of quantum dots separated by layers of cladding of a wider band gap material if desired.

The illustrated embodiment shows the deposited material, InGaAs, having a larger lattice parameter than its underlying GaAs substrate 12. However, it is also expressly contemplated as within the scope of the invention the deposited material may have a smaller lattice parameter than the substrate and can be used in the creation of similar quantum size structures.

The ability to create layers of quantum dots represents a significant resource to modify present optical and electronic technologies as well as developing new technologies heretofore not practical. Any type of device may be now fabricated using layers of quantum dots with the described method. Some examples of such devices are optical devices such as lasers which would exploit the enhanced optical gain due to the extremely peaked density states in the quantum dot. A vertical cavity surface emitting laser with one or more layers of dots in the active region is a direct application of the quantum dot structures disclosed here. By choosing the Fabry-Perot mirror period appropriately, one can select for a very narrow size of quantum dots in such a structure and tune the laser emission frequency. In addition, the absence of surfaces near the effective active region of this device, that is the quantum dots, reduces surface recombination and enhances lasing thresholds.

An additional example includes devices which are based on a Coulomb blockade effect as described by K. Mullen et al., Phys. Rev. B 37, 98 (1988) which would allow individual counting of electrons.

The described method is capable of producing self-assembled quantum dots with very small sizes, typically less than 30 nanometers with narrow size distribution, namely within plus or minus five percent of a mean. The principal used in the method lies in exploiting a lattice mismatch, typically between 0.1 percent and 10 percent between two semiconductor materials or two materials with different interfacial energies, which are grown epitaxially by molecular beam epitaxy or metal organic chemical vapor deposition. The method is successful because of the high degree of precision by which the growth transition from a two dimensional layer growth to a three dimensional island growth is detected and terminated. The transition from two to three dimensional growth is extremely abrupt and follows a first order phase transition process as a function of the epitaxial film layer thickness. To ensure narrow size distribution and the small sizes required for quantum dots, it is necessary to work at the boundary of the two to three dimensional growth transition. To facilitate this, an extremely slow growth rate of below 0.1 monolayer per second is used.

The In flux is calibrated with Rheed oscillations at 530 degrees centigrade by subtracting the Ga flux from the combined In and Ga flux. After formation of the self-assembled dots, the wafer is rapidly cooled to 350 degrees centigrade and removed from the growth chamber. Atomic force microscope measurements were then completed in ambient conditions. The height data was calibrated using standard gold gratings and monolayer height steps of 0.30 nanometers observable on the InAs surface of the wafer.

The results as shown in histograms of FIGS. 4a–d showing the statistical spread over several samples of the number of self-assembled dots as a function of diameter in the left column of histograms and height in the right column of histograms. The histograms were taken from a one-by-one micron atomic force microscope images from wafers with an estimated In As coverage of 1.6, 1.65, 1.75 and 1.9 monolayers in FIGS. 4a–d, respectively. One standard deviation in the self-assembled dot height was observed to be a variation of plus or minus 10 percent and in diameter a variation of plus or minus 7 percent in the initial stages of formation as shown in FIG. 4a.

As growth continued, the mean diameter decreased from nearly 30 nanometers to below 20 nanometers as shown in FIG. 4d. Additional strain induced by further coverage with InAs caused no further increase in diameter or height. Instead, at a size of approximately 30 nanometers in diameter, increased coverage on the wafer only served to increase the nucleated density of the self-assembled dots. It is suspected that the greater amount of nucleation led to a size reduction in the dots through In surface diffusion away from those dots already formed. At a density of approximately $4 \times 10^{10}$ per centimeter, large relaxed InAs islands form and further increases in dot density does not occur.

It was unexpected that after initial nucleation, further InAs coverage does not produce larger dots but simply increases the number of dots. This suggests an energy barrier to dot growth. The energy barrier to continued dot growth may simply be the energy barrier for nucleation of a misfit dislocation. Additionally, a strong correlation exists between dot formation and the nature of nucleation on the starting surface. The selection and nucleation sites by the dots was directly observed in the atomic force microscope images. Monolayer steps which were observed in the wafer surface provided preferential sites for dot nucleation at the step edges. This fact is later used as described below for positioning the quantum dots on a patterned wafer.

FIGS. 4a–d also indicate a relatively narrow distribution in the size of the self-assembled dots and demonstrates its functional dependence of dot size on the monolayer thickness of the epitaxial layer.

High quality self-assembled dots in an $In_{l-x}Ga_xAs/GaAs$ system and in an $In_{l-x}Al_xAs/Al_yGa_{l-y}As$ system (with $0<x$ and $y<1$) have been demonstrated. The InAlAs system luminesces in the visible range while the InGaAs system luminesces in the near infrared. The very high quality of these self-assembled quantum dot systems are demonstrated not only through measurement of their optical properties, but by also measurement of their transport properties. The structures have been fabricated both using molecular beam epitaxy growth and metal organic vapor deposition. The principle is operable regardless of whether the quantum dot material is under tension or compression with respect to the substrate material. The described method is general enough to include within its scope not only semiconductor systems, but also metals and combinations of the two.

FIG. 2 shows the creation of quantum dots in a random two dimensional array. However, it is also possible to fabricate the self-assembled quantum dots in specific positions on their underlying substrates. The positioning methodologies rely on controlling strain in the substrate as well as the nucleation and surface diffusion kinetics of the atoms that are used in making the quantum dots.

In a first embodiment, the diffusion coefficient is modulated by locally modulating the surface orientation of the substrate as shown in FIGS. 5a–d. GaAs substrate 12 as shown in FIG. 5a having a 50 Angstrom layer 24 of GaAs is photolithographicly patterned as shown in FIG. 5b, and etched as shown in FIG. 5c to produce facets 26. The prepared substrate of FIG. 5c is then subjected to the process of FIGS. 1a–c thereby resulting in the structure of FIG. 5d wherein quantum dots 28 uniformly position themselves on facets 26 by preferential nucleation of the deposited material. Because of the diffusion kinetics, quantum dots 28 tend to uniformly position themselves along the length of facets 26 thereby forming rows of substantially equally spaced quantum dots 28.

In a second method as diagrammatically depicted in FIGS. 6a–e strain sensitiveness of the two to three dimensional growth transition is exploited to position the quantum dots. The two to three dimensional growth transition will occur at a given thickness of the wetting layer. Thus, by incorporating a strain modulation on the surface of the wafer, regions with and without self-assembled quantum dots can be formed. FIG. 6a shows a GaAs substrate 12 on which is formed a 15 monolayer thick $In_{.2}Ga_{.8}As$ layer 30 capped with a GaAs layer 32. As shown in FIG. 6b, a photoresist 34 is selectively deposited on layer 32 to form a pattern by conventional means which is then etched as shown in FIG. 6b with defined mesa as generally denoted by reference numeral 36. Thereafter, the methodology of FIG. 1a–c is employed to result in the fabrication of quantum dots 38 in the valleys 40 between mesas 36 as depicted in FIG. 6d. $In_{0.5}Ga_{0.5}As$ islands 38 are deposited. Patterning mesas 36 to form intersecting lines thus may create an ordered array of mesa structures between which the self-assembled quantum dots will nucleate. Only 5 monolayers of $In_{0.5}Ga_{0.5}As$ will be needed to form the dot according to the diagram in FIG. 6f. To form dots on the mesas, 14 monolayers of $In_{0.29}Ga_{0.71}As$ in FIG. 6a will produce dots on top of the etched surface as shown in FIG. 6e.

In a third embodiment, a lateral composition fluctuation of the substrate is introduced by depositing a lateral superlattice prior to the fabrication of the self-assembled quantum dot layer. The method by which such superlattice is formed is shown and described in greater detail in U.S. Pat. No. 4,591,889, incorporated herein by reference as is set forth in its entirety. FIG. 7 shows in side cross sectional view the resulting structure which is shown in plan view in FIG. 8. GaAs substrate 12 is provided with a lateral superlattice 42 having regions 44 characterized by a lattice mismatch with the deposited materials and layers 46 of the same or lattice matching material with quantum dots 48. The quantum dots align with and nucleate on regions 44 forming equally spaced rows in the embodiment of FIG. 7 as depicted in plan view in FIG. 8. The ordering of quantum dots 48 in FIG. 8 arises from the strain field associated with each island or quantum dot and from the period of the lateral superlattice. The period of the superlattice may be adjusted from 8 to 32 nanometers, and is deposited by a self-assembling method.

Lasers using the self-assembled quantum dot arrays of the invention may be further improved by using an etching method immediately after the growth of the islands to remove the thin wetting layer 50 shown in FIGS. 1b and c. This is performed by using an in situ selective etching and regrowth method which preferentially removes the wetting layer without removing islands 20 that will become the self-assembled quantum dots after regrowth of the capping layer 22.

The quantum dots fabricated according to the invention result in a structure which allows the control of the sequential loading of the quantum dots with one or more electron, thereby making the dots an analog of an artificial atom. FIGS. 9a and b show the capacitance of the quantum dots fabricated according to the invention as a function of voltage for p-doped material in the case of FIG. 9a and n-doped material in the case of FIG. 9b. FIGS. 9a and b are the actual data readings showing capacitance peaks associated with loading of one, two and four electrons on self-assembled quantum dots in a diode containing approximately one million quantum dots. For example, in FIG. 9b in the case of the n-doped material, region 52 is associated with one and two electron per quantum dot, and region 54 is associated with four electrons per quantum dot. Region 56 arises from states created in overlying structural layers or interfaces. Similarly in the case of FIG. 9a relating to the p-doped material, region 60 is associated with one hole per quantum dot. The type of structure whose performance is described by FIGS. 9a and b may be used for building vertical tunnel diodes and Coulomb blocking structures that will work at high temperatures above 77 degrees Kelvin.

The capacitance peaks in FIGS. 9a and b are broad instead of the sharp lines as was expected. The rounding of the capacitance curve comes from the fact that there is a small size dispersion in the dimensions of the self-assembled quantum dots. To show how to make a sharper density of states associated with the dots, selection of only those dots in the array having the same dimensions can be achieved. Selection is effectuated by using a double tunnel barrier which acts as an energy filter for the electrons or holes that will fill up the dots as the device bias is increased. The structure shown in FIG. 10 can be employed for this purpose. GaAs substrate 12 is capped with a doped GaAs layer 64. A 50 Angstrom barrier layer 66 of $Al_{.3}Ga_{.7}As$ is disposed on capping layer 64 and is followed by a 20 Angstrom GaAs tunnel well layer 68. A second barrier layer 70 of $Al_{.3}Ga_{.7}As$ is disposed on tunnel layer 68 and is followed by an undoped GaAs layer 72 which is about 150 Angstroms in depth. The quantum dot deposition layer 14 follows with the fabrication of two monolayer thickness of InGaAs quantum dot 74 which in the illustrated embodiment has a lateral interface dimension of 20 nanometers and is formed according to the method shown in FIGS. 1a–c. A capping layer 76 of 50 Angstroms of GaAs is then disposed on quantum dot 74 and it then followed by a short period superlattice 78 of AlAs/GaAs. The 300 Angstrom thick superlattice layer 78 is then capped with a 50 Angstrom thick GaAs cap 80.

The corresponding energy diagram of FIG. 10b is aligned with FIG. 10a to show the energy levels of the structure of FIG. 10a. The Fermi energy, $E_f$, of electrons in the material is depicted by line 82. Therefore, the electrons in the device of FIG. 10a which have an energy sufficient to tunnel through double barrier 66 and 70 are available to be inserted into the quantum dot 74. Therefore, only those electrons having a certain predefined tunneling energy will be retained in those quantum dots having a size and hence potential well depth into which the selected electrons can find an open compatible energy state. The sharpening of the density states will then provide a sharper electrical behavior than that shown in FIGS. 9a and 9b.

In the illustrated embodiment, InAs was grown by molecular beam epitaxy on a 0.5 micron (100) GaAs buffer layer 12 which included a GaAs/AlAs short period superlattice. The substrate temperature during the deposition was 530 degrees C. as measured by a pyrometer. At this temperature a cubic (4×4) GaAs reconstruction begins to give way to the 2×4 reconstruction. Above this temperature Indium significantly desorbs from the surface.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition structure, material or acts beyond the scope of the commonly defined meanings. The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method of forming quantum dots comprising:

deposing a material having a first lattice spacing on a substrate having a second unequal lattice spacing to produce self-assembled quantum dots;

continuously observing surface texture of said first material as it is being disposed on said substrate; and immediately terminating deposition of said first material on said substrate as soon as a predetermined number of said self-assembled quantum dots form as determined by observation of said surface texture during deposition of said first material, whereby a plurality of quantum dots of predetermined size and density are controllably and reliably fabricated.

2. The method of claim 1 where observing said surface texture of said first material comprises exposing said surface of said first material to high energy electrons and detecting a reflection high energy electron diffraction pattern produced therefrom.

3. The method of claim 1 where deposition of said first material on said substrate comprises cycles of disposing a fractional monolayer of said first material followed by a no growth pause of a predetermined time period.

4. The method of claim 3 where deposition of said fractional monolayer of said first material is at a rate of the order of 0.1 monolayer per second.

5. The, method of claim 4 where said no growth pause has a period of approximately three seconds.

6. The method of claim 1 further comprising deposing a capping layer on said self-assembled quantum dots composed of a second material on said substrate.

7. The method of claim 1 where deposing said first material on said substrate deposes said first material having a greater lattice spacing than said substrate thereby placing said first material under compression.

8. A method of forming quantum dots comprising:

depositing a first material havings a first lattice spacing on a substrate having a second unequal lattice spacing to produce self-assembled quantum dots, where depositing said first material on said substrate deposes a first material having a lattice spacing less than said lattice spacing of said substrate thereby placing said first material under tension;

continuously observing surface texture of said first material as it is being deposed on said substrate; and immediately terminating deposition of said first material on said substrate as soon as a predetermined number of self-assembled quantum dots form as determined by observation of said surface texture during deposition of said first material, whereby a plurality of quantum dots of predetermined size and density are controllably and reliably fabricated.

9. The method of claim 1 wherein depositing said first material on said substrate deposes InAs on a GaAs substrate thereby forming InGaAs self-assembled quantum dots.

10. The method of claim 1 wherein depositing said first material on said substrate deposes InAlAs as said first material on an AlGaAs substrate thereby forming InAlAs self-assembled quantum dots.

11. The method of claim 1 where depositing said first material on said substrate is by moleuclar beam epitaxy.

12. The method of claim 1 where depositing said first material on said substrate is by metal organic chemical vapor deposition.

13. The method of claim 1 where depositing said first material on said substrate is by vapor phase epitaxy.

14. The method of claim 1 where depositing said first material on said substrate is by chemical beam epitaxy.

15. The method of claim 1 where depositing said first material on said substrate is by gas source molecular beam epitaxy.

16. The method of claim 1 where depositing said first material on said substrate deposes semiconductors from Groups IIIa and Va of the periodic table.

17. A method of forming quantum dots comprising:

depositing a first material having a first lattice spacing on a substrate having a second unequal lattice spacing to produce self-assembled quantum dots.

where depositing said first material on said substrate deposes semiconductors from Groups IIb and VIa of the periodic table;

continuously observing surface texture of said first material as it is being deposed on said substrate; and immediately terminating deposition of said first material on said substrate as soon as a predetermined number of self-assembled quantum dots form as determined by observation of said surface texture during deposition of said first material, whereby a plurality of quantum dots of predetermined size anti density are controllably and reliably fabricated.

18. A method of forming quantum dots comprising:

depositing a first material having a first lattice spacing on a substrate having a second unequal lattice spacing to produce self-assembled quantum dots, where depositing said first material on said substrate deposes semiconductors from different elements from Group IVa of the periodic table;

continuously observing surface texture of said first material as it is being deposed on said substrate; and immediately terminating deposition of said first material on said substrate as soon as a predetermined number of self-assembled quantum dots form as determined by observation of said surface texture during deposition of said first material, whereby a plurality of quantum dots of predetermined size and density are controllably and reliably fabricated.

19. A method of forming quantum dots comprising:

depositing a first material having a a first lattice spacing on a substrate having a second unequal lattice spacing to produce self-assembled quantum dots, where depositing said first material on said substrate deposes semiconductors from consecutively grown epitaxial metals and oxides with a lattice mismatch;

continuously observing surface texture of said first material as it is being deposed on said substrate; and immediately terminating deposition of said first material on said substrate as soon as a predetermined number of self-assembled quantum dots form as determined by observation of said surface texture during deposition of said flint material, whereby a plurality of quantum dots of predetermined size and density are controllably and reliably fabricated.

20. The method of claim 1 further comprising forming selected regions of preferred nucleation for said self-assembled quantum dots on said substrate prior to depositing said first material on said substrate to align said self-assembled quantum dots in a predetermined two dimensional pattern.

21. The method of claim 20 wherein said selected regions of preferred nucleation are formed by locally modulating surface orientation of said substrate.

22. The method of claim 21 wherein said substrate has a primary surface upon which said first material is directed, and wherein locally modulating the surface orientation of said substrate comprises forming facets in said substrate inclined at an angle with respect to said primary surface of said substrate.

23. The method of claim 20 where forming said selected regions of preferred nucleation comprises locally modulating surface strain of said substrate.

24. A method of forming quantum dots comprising:

depositing a first material having a first lattice spacing on a substrate having a second unequal lattice spacing to produce self-assemble quantum dots;

forming selected regions of preferred nucleation for said self-assembled quantum dots on said substrate prior to depositing said first material on said substrate to alien said self-assembled quantum dots in a predetermined two dimensional pattern, where forming said selected regions of preferred nucleation comprises locally modulating surface strain of said substrate, and where said substrate has a primary surface upon which said self-assembled quantum dots are formed and where locally modulating surface strain of said substrate comprises selectively forming a third material having a lattice mismatch with said second material of said substrate selectively underlying surface portions of said primary surface of said substrate;

continuously observing surface texture of said first material as it is being deposed on said substrate; and immediately termination deposition of said first material on said substrate as soon as a predetermined number self-assembled quantum dots form as determined by observation of said surface texture during deposition of said first material, whereby a plurality of quantum dots of predetermined size and density are controllably and reliably fabricated.

25. A method of forming quantum dots comprising:

deposing a first material having a first lattice spacing on a substrate having a second unequal lattice spacing to produce self-assembled quantum dots;

forming selected regions of preferred nucleation for said self-assembled quantum dots on said substrate odor to deposing said first material on said substrate to align said self-assembled quantum dots in a predetermined two dimensional pattern, where said substrate has a primary surface onto which said first material of said self-assembled quantum dots is formed and where forming selected regions of preferred nucleation comprises providing a fluctuating material composition in said primary surface of said substrate;

continuously observing surface texture of said first material as it is being deposed on said substrate; and immediately terminating deposition of said first material on said substrate as soon as a predetermined number of self-assembled quantum dots form as determined by observation of said surface texture during deposit of said first material, whereby a plurality of quantum dots of predetermined size and density are controllably and reliably fabricated.

26. The method of claim 25 where providing said fluctuating material composition in said primary surface of said substrate comprises defining a lateral superlattice into said primary surface of said substrate, said superlattice having two distinct regions, a first region having a lattice mismatch with said first material and said second region being substantially lattice matched with said first material.

* * * * *